United States Patent
Kanai et al.

(10) Patent No.: US 11,888,244 B2
(45) Date of Patent: Jan. 30, 2024

(54) MICROSTRIP ANTENNA AND WEARABLE SENSOR TERMINAL

(71) Applicant: PANASONIC INTELLECTUAL PROPERTY MANAGEMENT CO., LTD., Osaka (JP)

(72) Inventors: Kazuki Kanai, Kanagawa (JP); Yuki Tanaka, Tokyo (JP); Ryosuke Hasaba, Kanagawa (JP); Haruo Hayakawa, Kanagawa (JP); Yoshio Koyanagi, Kanagawa (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 299 days.

(21) Appl. No.: 17/479,460

(22) Filed: Sep. 20, 2021

(65) Prior Publication Data
US 2022/0006194 A1    Jan. 6, 2022

Related U.S. Application Data

(63) Continuation of application No. PCT/JP2020/018277, filed on Apr. 30, 2020.

(30) Foreign Application Priority Data

May 9, 2019   (JP) .................. 2019-089071

(51) Int. Cl.
*H01Q 1/27*   (2006.01)
*H01Q 9/04*   (2006.01)

(52) U.S. Cl.
CPC ............. *H01Q 9/045* (2013.01); *H01Q 1/273* (2013.01)

(58) Field of Classification Search
CPC .......... H01Q 1/27; H01Q 1/273; H01Q 1/425; H01Q 9/04; H01Q 9/045; H01Q 9/0407;
(Continued)

(56) References Cited

U.S. PATENT DOCUMENTS 7,116,940 B2 * 10/2006 Dvorak .................. H04B 1/385
455/66.1
7,782,269 B2 * 8/2010 Soler Castany ..... H01Q 9/0407
343/846

(Continued)

FOREIGN PATENT DOCUMENTS

JP      H03-268503 A    11/1991
JP      H05-206716 A    8/1993
(Continued)

OTHER PUBLICATIONS

International Search Report dated Jul. 28, 2020 issued in PCT/JP2020/018277.
Written Opinion dated Jul. 28, 2020 issued in PCT/JP2020/018277.

*Primary Examiner* — Thai Pham
(74) *Attorney, Agent, or Firm* — Pearne & Gordon LLP

(57) ABSTRACT

A microstrip antenna includes a first metal layer that constitutes an antenna element, a second metal layer that constitutes a ground, and a flexible member that separates the first metal layer and the second metal layer by a predetermined distance. The first metal layer and the second metal layer each are made of a metal or a metal foil. At least one of the first metal layer and the second metal layer is not adhered to the flexible member but is in close contact with the flexible member by a close contact unit. The close contact unit is a clamping mechanism including a first plate, a second plate, and a connecting member. The first plate and the second plate are connected to each other by the connecting member. The connecting member is an elastic body.

5 Claims, 12 Drawing Sheets

(58) Field of Classification Search
CPC ........ H01Q 13/10; H01Q 13/106; H01P 1/02; H01P 3/02
See application file for complete search history.

(56) References Cited

U.S. PATENT DOCUMENTS

| | | | |
|---|---|---|---|
| 9,698,472 B2 * | 7/2017 | Miškovský | H01Q 9/40 |
| 10,256,533 B2 * | 4/2019 | Hirabayashi | H01Q 1/273 |
| 2003/0169207 A1 * | 9/2003 | Beigel | H01Q 9/0407 |
| | | | 343/718 |
| 2015/0255860 A1 * | 9/2015 | Lienau | H01Q 1/273 |
| | | | 343/702 |

FOREIGN PATENT DOCUMENTS

| | | |
|---|---|---|
| JP | 2007-104257 A | 4/2007 |
| JP | 2007-286214 A | 11/2007 |
| JP | 2008-277493 A | 11/2008 |
| JP | 2011-146779 A | 7/2011 |
| JP | 2012-253700 A | 12/2012 |
| JP | 2013-098320 A | 5/2013 |
| JP | 2014-168272 A | 9/2014 |

* cited by examiner

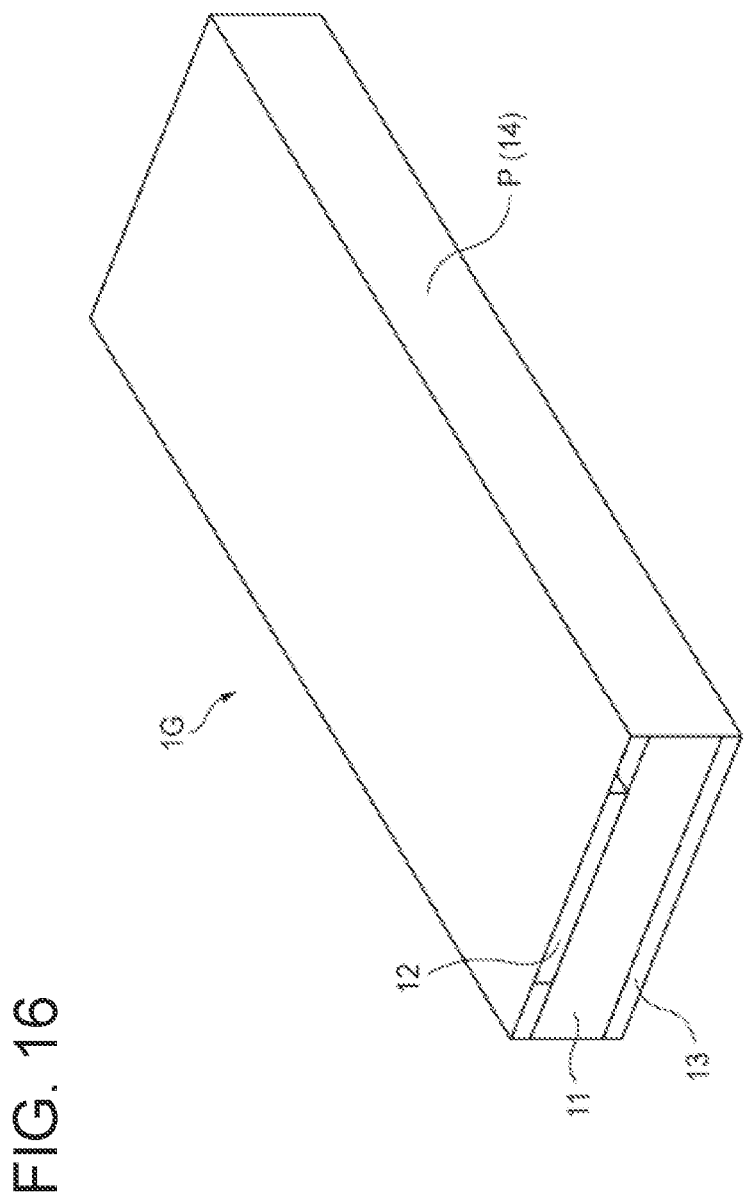

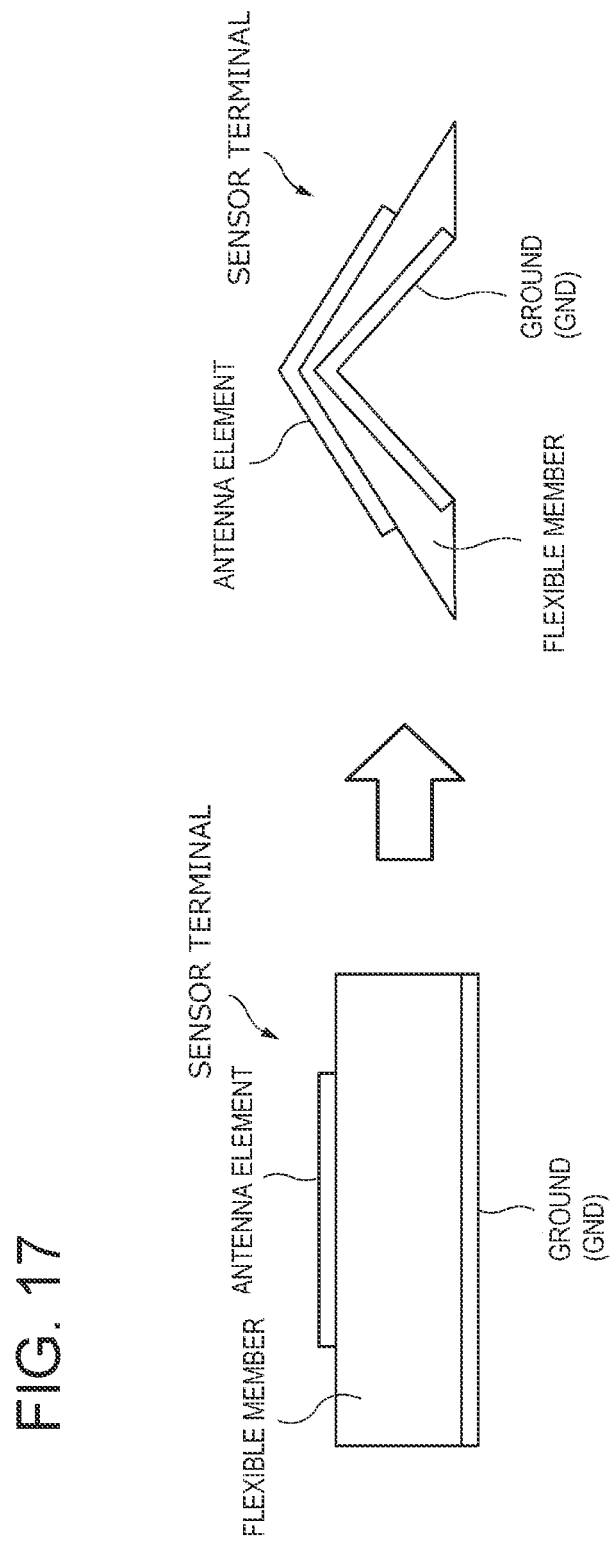

MICROSTRIP ANTENNA AND WEARABLE SENSOR TERMINAL

CROSS-REFERENCE TO RELATED APPLICATIONS

This is a continuation of International Application No. PCT/JP2020/018277 filed on Apr. 30, 2020, and claims priority from Japanese Patent Application No. 2019-089071 filed on May 9, 2019, the entire content of which is incorporated herein by reference.

TECHNICAL FIELD

The present disclosure relates to a microstrip antenna and a wearable sensor terminal.

BACKGROUND ART

JP-A-2007-286214 discloses a wearing band in which an inlet for wirelessly transmitting information recorded in an IC chip by an antenna is installed. The wearing band is firmed in a ring shape wearable to a part of a human body, and includes an RFID tag containing the inlet by a hard film made of resin and an elastic body containing the RFID tag and formed in a ring shape. The RFID tag is configured such that a strain in a tensile direction per unit tensile force of the RFID is smaller than that of the elastic body.

The technique described above relates to the wearing band suitable for identifying an individual by being worn on a part of a human body. However, since the hard film contains the inlet, rigidity of the hard film makes the RFID tag less bendable. In addition, the above technique is different in structure from a wearable sensor terminal of the present disclosure, which uses energy harvesting, on the premise of a two-layer structure of an antenna element and a ground (GND).

There is a wireless sensor network in which a large number of wireless sensors are arranged and information from the wireless sensors is collected. The wireless sensor network is used for applications such as IoT. As a power supply for a sensor terminal used in the wireless sensor network, a primary battery such as a button battery a solar cell, a thermoelectric conversion element, or the like is used.

However, the primary battery requires battery replacement. In the wireless sensor network in which a large number of sensor terminals are used, an operation of the battery replacement is complicated. In addition, the solar cell and the thermoelectric conversion element have high material costs and cost becomes a problem in arranging the large number of sensor terminals. The problem related to the power supply is a barrier for the widespread use of wireless sensor network.

Here, since a sensor system using a radio frequency identifier (RFID) as a communication unit does not spontaneously transmit communication radio waves, electric power consumption is low, and the energy harvesting can be used as a power supply. The RF energy harvesting technique uses wireless electric power as a part or all of the power supply. According to this technique, it is possible to realize a sensor terminal that is wireless and does not require battery replacement at low cost.

In recent years, there is a demand for a wearable battery-less sensor terminal. As an example, from the viewpoint of nursing, if there is a sensor terminal that does not require battery replacement, it is possible to safely and reliably acquire biological information (vital data) of a patient or the like wearing the sensor terminal, and it is also possible to prevent data acquisition from failing due to battery exhaustion. In addition, since maintenance cost for battery replacement is not required, the cost is low.

The applicant has considered that the above-described RF energy harvesting type sensor is used as a wearable sensor terminal that does not require battery replacement. That is, a person wears the sensor terminal, performs wireless power supply to the sensor terminal, operates the sensor, and acquires data.

Here, in order to improve a wearable property of the sensor terminal, flexibility of the entire sensor terminal is required. For example, if a sensor terminal is used by winding it around a wrist, even when the sensor terminal is curved with a constant radius of curvature, it is necessary to be able to maintain a function of the sensor terminal without creasing, breaking, or the like of a member of the sensor terminal.

Reception electric power of the RF energy harvesting using microwaves largely depends on a performance of the antenna. However, in a case that the antenna is close to a human body, problems such as a decrease in radiation efficiency and a change in impedance occur. In order to cope with these problems, it is desirable for a power receiving antenna of the RF energy harvesting type sensor to reduce an influence from the human body using a planar antenna such as a microstrip antenna (MSA) having a ground (GND). The microstrip antenna requires at least two layers of the antenna element and the ground (GND).

FIG. 17 is a conceptual diagram showing a normal state and a curved state of a microstrip antenna having a two-layer structure. In a sensor terminal shown in FIG. 17, an antenna element is patterned on an upper surface of a flexible member having flexibility, and a ground (GND) is formed on a lower surface of the flexible member.

Here, in order to realize high efficiency and high gain performance, it is desirable that the antenna element arranged on the upper surface and the ground (GND) on the lower surface are separated by about several millimeters. In addition, the antenna needs to be large enough for a wavelength.

In a case where a layer of the antenna element and a layer of the ground (GND) are formed on the flexible member, since there is a difference in a shrinkage rate between the layer of the antenna element and the layer of the ground, it is difficult to form a stable pattern. For example, as shown in FIG. 17, in a case where the sensor terminal is curved, problems such as crease and breakage of the pattern forming the antenna element and the ground (GND), or a large change in a distance between the antenna element and the ground (GND) and a change in the characteristics of the antenna occur.

As described above, it has been difficult to make the sensor terminal provided with the two-layer microstrip antenna having a predetermined thickness wearable so that the above-mentioned problems do not occur when the sensor terminal is curved with a small radius of curvature such as winding around an arm.

SUMMARY

The present disclosure has been made in view of the above problems, and an object of the present disclosure is to provide a wearable battery-less sensor terminal at low cost by providing a sensor terminal provided with a microstrip antenna having a two-layer structure having a predetermined thickness with sufficient flexibility as a whole.

Aspect of non-limiting embodiments of the present disclosure relates to a microstrip antenna that includes a first metal layer that constitutes an antenna element, a second metal layer that constitutes a ground, and a flexible member that separates the first metal layer and the second metal layer by a predetermined distance. The first metal layer and the second metal layer each are made of a metal having flexibility or made of a metal foil formed on a material having flexibility. The first metal layer and/or the second metal layer are not adhered to the flexible member but are in close contact with the flexible member by a close contact unit.

According to the above configuration, in a case that the microstrip antenna is curved, the metal layer that is not adhered to the flexible member is curved while sliding with respect to the flexible member to absorbs the difference in the shrinkage ratio described above. In addition, since the metal layer that is not adhered to the flexible member is curved so as to follow the flexible member while being in close contact with the flexible member, the distance between the first metal layer and the second metal layer can be maintained constant. By using the microstrip antenna having such a configuration, it is possible to provide the wearable battery-less sensor terminal at low cost by providing the sensor terminal provided with the microstrip antenna having a two-layer structure having the predetermined thickness with sufficient flexibility as a whole.

According to the present disclosure, it is possible to provide the wearable battery-less sensor terminal at a low cost by providing the sensor terminal provided with the microstrip antenna having the two-layer structure having the predetermined thickness with the sufficient flexibility as a whole.

BRIEF DESCRIPTION OF DRAWINGS

FIG. 16 is a diagram showing a microstrip antenna 1G according to a seventh embodiment of the present disclosure.

FIG. 17 is a conceptual diagram showing a normal state and a curved state of the microstrip antenna having a two-layer structure.

DESCRIPTION OF EMBODIMENTS

Hereinafter, the present disclosure will be described in detail with reference to the drawings as appropriate. Note that the accompanying drawings and the following description are provided for a person skilled in the art to sufficiently understand the present disclosure, and are not intended to limit the subject matter described in the claims.

Figure 1:
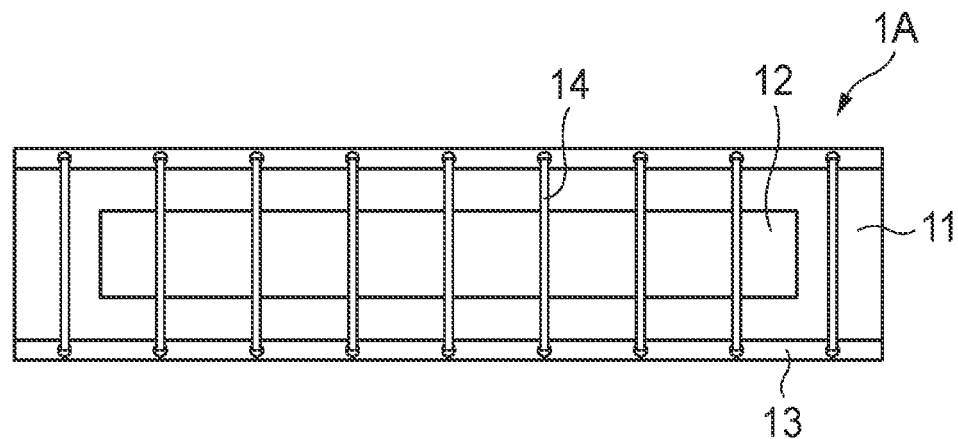
FIG. 1 is a plan view of a microstrip antenna 1A according to a first embodiment of the present disclosure.
Figure 2:
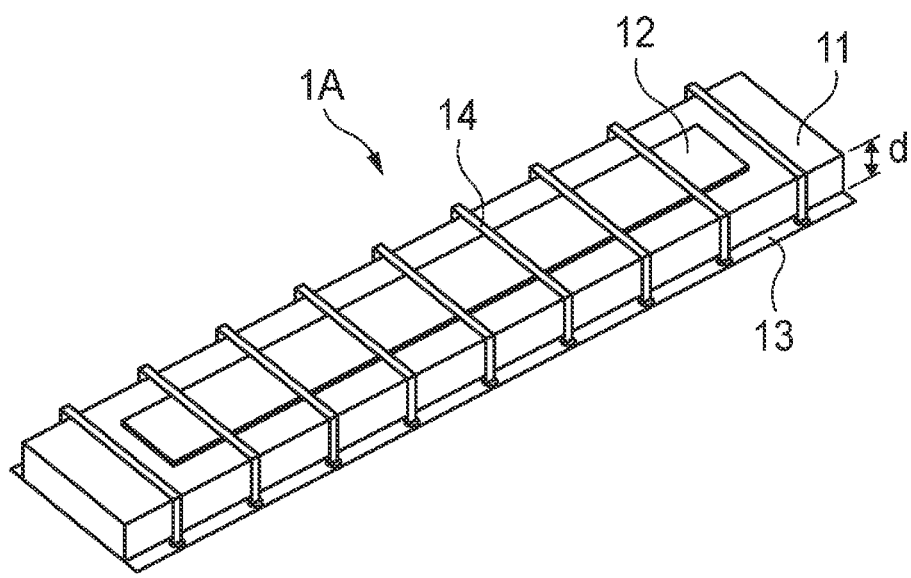
FIG. 2 is a perspective view of the microstrip antenna 1A according to the first embodiment of the present disclosure.
Figure 3:
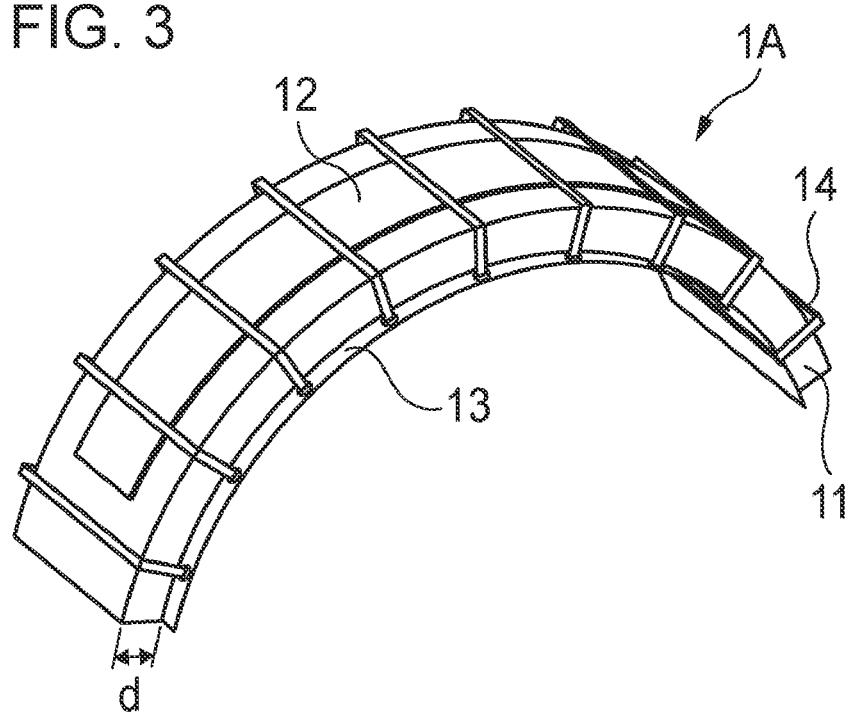
FIG. 3 is a diagram showing a curved state with a small curvature of the microstrip antenna 1A according to the first embodiment of the present disclosure.
Figure 4:
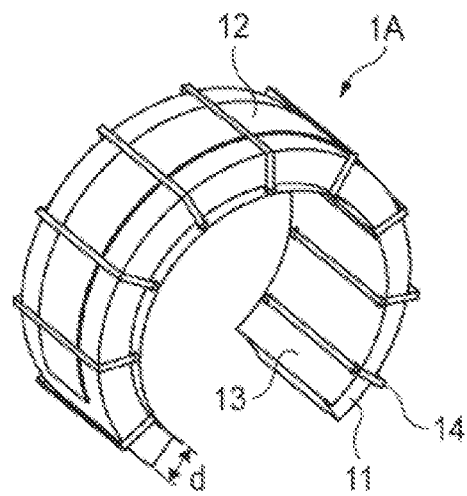
FIG. 4 is a diagram showing a curved state with a large curvature of the microstrip antenna 1A according to the first embodiment of the present disclosure.

FIG. 1 is a plan view of a microstrip antenna 1A according to a first embodiment of the present disclosure. FIG. 2 is a perspective view of the microstrip antenna 1A according to the first embodiment of the present disclosure. FIG. 3 is a diagram showing a curved state with a small curvature of the microstrip antenna 1A according to the first embodiment of the present disclosure. FIG. 4 is a diagram showing a curved state with a large curvature in the microstrip antenna 1A according to the first embodiment of the present disclosure. The microstrip antenna 1A includes a flexible member 11, a first metal layer 12, and a second metal layer 13. In addition, as shown in FIG. 2, the microstrip antenna 1A is formed by sandwiching the flexible member 11 between the first metal layer 12 and the second metal layer 13.

The flexible member 11 is a nonconductor having a predetermined thickness d, and is used such that the thickness does not change before and after curving even when the flexible member 11 is curved. The expression "the thickness does not change" here means that a variation of the thickness falls within a range of ±40% of the predetermined thickness d. Noted that the predetermined thickness d of the flexible member is, for example, 3 mm to 5 mm (in a case where 920 MHz band is used as RF). A material of the flexible member 11 may be silicone or the like. However, the present disclosure is not limited thereto.

Each of the first metal layer 12 and the second metal layer 13 is made of a metal having flexibility or a metal foil formed on a material having flexibility. Noted that "flexible" and "having flexibility" in the present application mean that an expansion and contraction ratio thereof is ±3% or more. As an example, each of the first metal layer 12 and the second metal layer 13 may be formed of a copper plate. Each of the first metal layer 12 and the second metal layer 13 may be formed by patterning a synthetic resin such as PET with copper. The first metal layer 12 constitutes an antenna element, and the second metal layer 13 constitutes a ground (GND).

With the above-described configuration, a distance between the first metal layer 12 and the second metal layer 13 sandwiching the flexible member 11 having the predetermined thickness d coincides with the predetermined thickness d. That is, the flexible member 11 separates the first metal layer 12 and the second metal layer 13 by the predetermined distance d.

Figure 5:
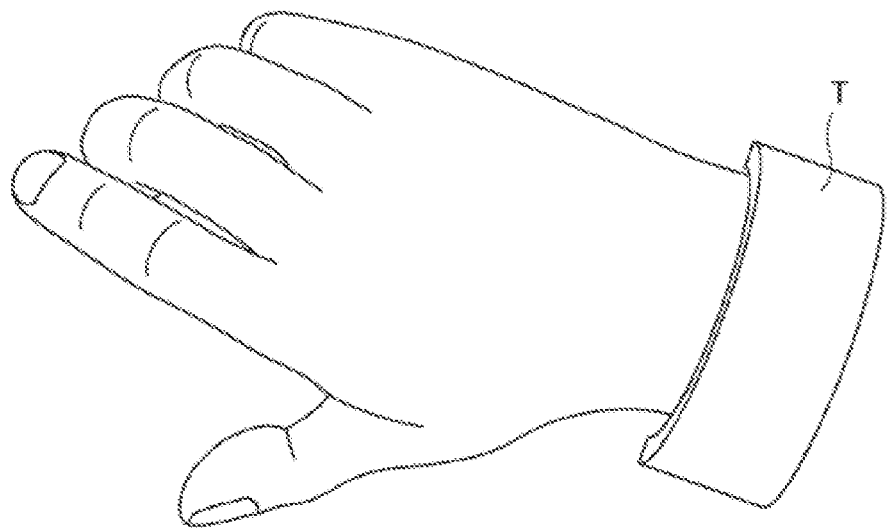
FIG. 5 is a diagram showing a state in which a person wears a wearable sensor terminal T having the microstrip antenna 1A therein.

Here, reference is made to FIG. 5. FIG. 5 is a diagram showing a state in which a person wears a wearable sensor terminal T having the microstrip antenna 1A therein. The microstrip antenna 1A is wound around a wrist of the person in a band shape.

The wearable sensor terminal T includes a sensor circuit (not shown the sensor circuit senses biological information of a wearer (person) of the wearable sensor terminal T, and the acquired biological information can be wirelessly transmitted to the outside. In addition, the microstrip antenna 1A receives a microwave, so that it is also possible to ensure electric power for activating the sensor circuit.

Here, as described above, when the antenna is close to a human body, problems such as a decrease in radiation efficiency and a change in impedance occur. However, if the wearable sensor terminal T is wound such that the second metal layer 13 constituting the ground (GND) is on an inner side (a side in contact with the human body), an influence of the human body (wrist) on the antenna can be reduced.

Although FIG. 5 shows an example in which the wearable sensor terminal T is wound around the wrist, a wearing position of the wearable sensor terminal T of the present disclosure is not limited to the arm. For example, the wearable sensor terminal T of the present disclosure may be worn to other parts of a human body such as the waist and ankle. At the time of wearing, as shown in FIG. 5, it is necessary to curve the wearable sensor terminal T together with the microstrip antenna 1A included in the wearable sensor terminal T. Therefore, the microstrip antenna 1A needs to have enough flexibility (softness) to withstand curving.

Returning to FIGS. 1 to 4, a description will be given. In a case where the first metal layer 12 and the second metal layer 13 are adhered to the flexible member 11 or the first metal layer 12 and the second metal layer 13 are integrally formed with the flexible member 11, as described above, crease or breakage of the metal layer due to a difference in a shrinkage rate between the first metal layer 12 and the second metal layer 13 may occur. This is because the flexible member 11 is present between the first metal layer 12 and the second metal layer 13, and the flexible member 11 has the predetermined thickness d.

Therefore, in the microstrip antenna 1A of the present disclosure, at least one of the first metal layer 12 and the second metal layer 13 is not adhered to the flexible member 11, but is brought into close contact with the flexible member 11 with a predetermined pressure or the like.

In the example shown in FIGS. 1 and 2, the first metal layer 12 constituting the antenna element is adhered to the flexible member 11. On the other hand, the second metal layer 13 constituting the ground (GND) is not adhered to the flexible member 11.

However, when the distance between the first metal layer 12 constituting the antenna element and the second metal layer 13 constituting the ground (GND) varies, the characteristic (for example, the resonance frequency) of the microstrip antenna 1A changes. In order to prevent such a change of the characteristic of the microstrip antenna 1A, the microstrip antenna 1A has a close contact unit 14. The close contact unit 14 is a rubber member in the examples of FIGS. 1 to 4. In this example, the close contact unit 14, which is an annular rubber member, passes through holes provided at end portions of the second metal layer 13 constituting the ground, and brings the second metal layer 13 into close contact with the flexible member 11. In the examples of FIGS. 1 to 4, a plurality of annular rubber members having a narrow width are used as the close contact unit 14. However, the close contact unit 14 may be, for example, a wide cylindrical rubber member. The first metal layer 12, the flexible member 11, and the second metal layer 13 are wrapped with the cylindrical rubber member. Then, due to an elastic force of the cylindrical rubber member, the second metal layer 13 is pressed against the flexible member 11 and brought into close contact with the flexible member 11.

For example, as described above, the close contact unit 14 brings the metal layer (the second metal layer 13 in this example), which is not adhered to the flexible member 11, into close contact with the flexible member 11. If the second metal layer 13 and the flexible member 11 are in close contact with each other, the distance between the first metal layer 12 and the second metal layer 13 can be maintained constant, and the characteristic of the microstrip antenna 1A can be maintained constant.

In a case where the first metal layer 12 is not adhered to the flexible member 11 in addition to the second metal layer 13, the close contact unit 14 can bring both the first metal layer 12 and the second metal layer 13 into close contact with the flexible member 11. In this case, the same effect as described above can be achieved.

At least one of the two metal layers is not adhered to but is brought into close contact with the flexible member 11, so that it is possible to stably curve the microstrip antenna 1A.

FIGS. 3 and 4 show a state in which the microstrip antenna 1A is curved, respectively. The first metal layer 12 and the second metal layer 13 are curved so as to follow the curving of the flexible member 11.

In the examples of FIGS. 1 to 4, since the second metal layer 13 is not adhered to the flexible member 11, the second metal layer 13 is curved while sliding with respect to the flexible member 11 to absorb the difference in the shrinkage rate described above. Therefore, even when the microstrip antenna 1A is curved, the metal layer is not creased or broken.

Therefore, the microstrip antenna 1A of the present disclosure can be used in, for example, the wearable sensor terminal T (see FIG. 5) of a type that is wound around a wrist.

The microstrip antenna 1A according to the first embodiment of the present disclosure has been described above with reference to FIGS. 1 to 4 and 5.

As described above, in the microstrip antenna 1A according to the first embodiment of the present disclosure, the first metal layer 12 is adhered to the flexible member 11, and the second metal layer 13 is not adhered to the flexible member 11. In a case where one of the two metal layers is adhered to the flexible member 11, the metal layer to be adhered is exemplarily the first metal layer 12 constituting the antenna element. This is because it is better to prevent the antenna element from sliding from a viewpoint of stabilizing a resonance frequency.

However, from the viewpoint of preventing the metal layer from being creased or broken, both the first metal layer 12 and the second metal layer may not be adhered to the flexible member 11.

Figure 6:
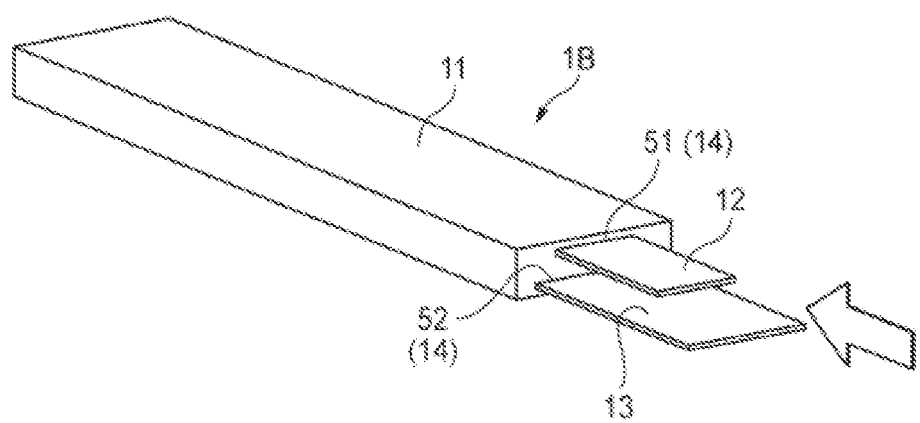
FIG. 6 is a diagram showing a state in which a metal layer is being inserted in a flexible member of a microstrip antenna 1B according to a second embodiment of the present disclosure.
Figure 7:
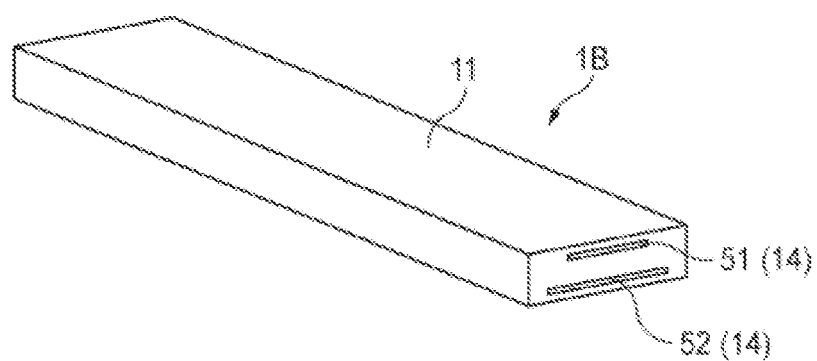
FIG. 7 is a diagram showing a state of the microstrip antenna 1B according to the second embodiment of the present disclosure after insertion of the metal layer into the flexible member.
Figure 8:
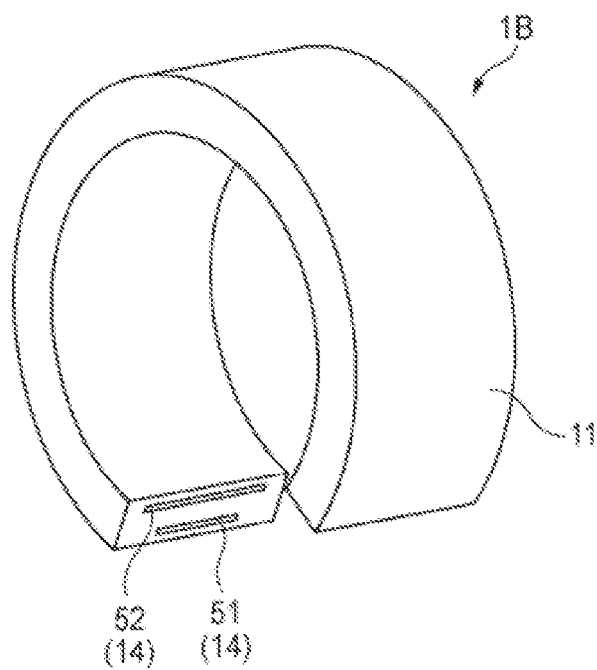
FIG. 8 is a diagram showing a curved state of the microstrip antenna 1B according to the second embodiment of the present disclosure.

FIG. 6 is a diagram showing a state in which a metal layer is being inserted in a flexible member of a microstrip antenna 1B according to a second embodiment of the present disclosure. FIG. 7 is a diagram showing a state of the microstrip antenna 1B according to the second embodiment of the present disclosure after insertion of the metal layer into the flexible member. FIG. 8 is a diagram showing a curved state of the microstrip antenna 1B according to the second embodiment of the present disclosure.

As in the case of the microstrip antenna 1A described above, the microstrip antenna 1B includes the flexible member 11, the first metal layer 12, and the second metal layer 13. In the microstrip antenna 1B according to the second embodiment, the first metal layer 12 and the second metal layer 13 are inserted into the flexible member 11.

In the microstrip antenna 1B according to the second embodiment, the flexible member 11 includes slots 51, 52. The two slots 51, 52 are arranged side by side in a thickness direction of the flexible member 11. The distance between the two slots 51, 52 is set to the predetermined distance d.

Then, as shown in FIG. 6, the first metal layer 12 is inserted into the slot 51 and the second metal layer 13 is inserted into the slot 52. Then, in the microstrip antenna 1B, the first metal layer 12 and the second metal layer 13 are separated by the predetermined distance d (see FIG. 7).

In the examples of FIGS. 6 to 8, the first metal layer 12 is not adhered to the flexible member 11. The second metal layer 13 is also not adhered to the flexible member 11. Both the first metal layer 12 and the second metal layer 13 are in close contact with the flexible member 11. That is, the slots 51, 52 function as the close contact unit 14.

The microstrip antenna 1B configured as described above is curved as shown in FIG. 8. The first metal layer 12 and the second metal layer 13 are not adhered to the flexible member 11. Therefore, the first metal layer 12 and the second metal layer 13 are curved while sliding with respect to the flexible member 11 to absorb the difference in the shrinkage ratio described above. Therefore, even when the microstrip antenna 1B is curved, the metal layer is not creased or broken.

Figure 9:
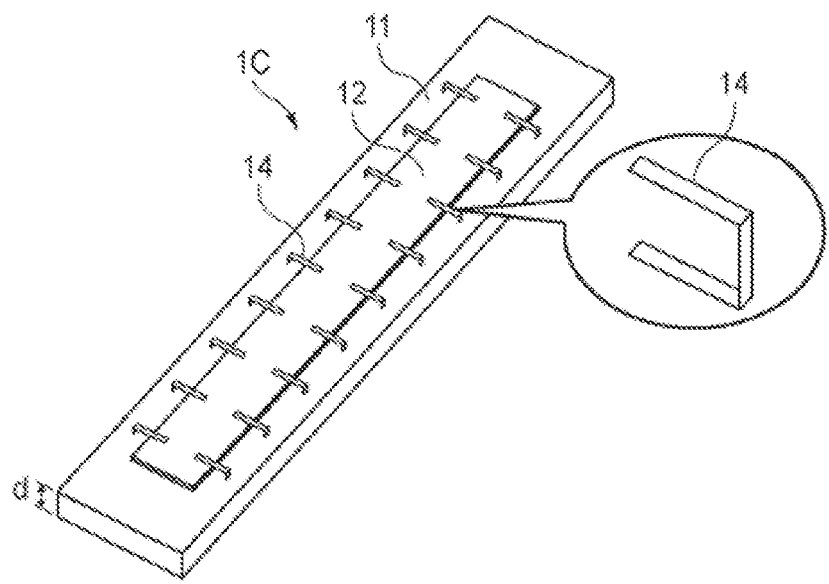
FIG. 9 is a perspective view showing a surface of a microstrip antenna 1C according to a third embodiment of the present disclosure.
Figure 10:
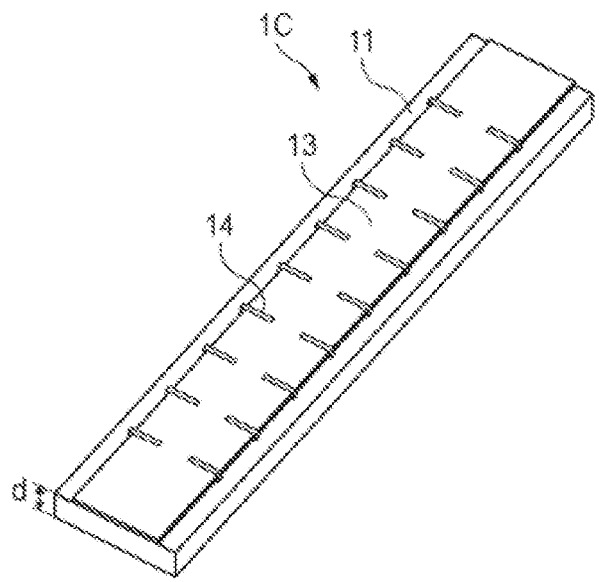
FIG. 10 is a perspective view showing a back surface of the microstrip antenna 1C according to the third embodiment of the present disclosure.
Figure 11:
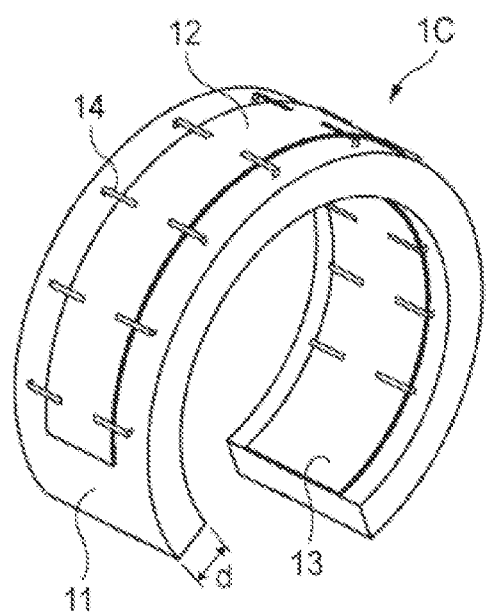
FIG. 11 is a diagram showing a curved state of the microstrip antenna 1C according to the third embodiment of the present disclosure.

FIG. 9 is a perspective view showing a surface of a microstrip antenna 1C according to a third embodiment of the present disclosure. FIG. 10 is a perspective view showing a back surface of the microstrip antenna 1C according to the third embodiment of the present disclosure. FIG. 11 is a diagram showing a curved state of the microstrip antenna 1C according to the third embodiment of the present disclosure.

A point that the microstrip antenna 1C includes the flexible member 11, the first metal layer 12, and the second metal layer 13 is the same as that in the first embodiment described with reference to FIGS. 1 to 4. In addition, points that the microstrip antenna 1C is formed by sandwiching the flexible member 11 between the first metal layer 12 and the second metal layer 13, the predetermined thickness d of the flexible member 11 and the material of each member are the same as those in the first embodiment.

In the microstrip antenna 1C shown in FIGS. 9 to 11, a U-shaped pin is used as the close contact unit 14 (see FIG. 9). The material of the U-shaped pin may be a resin such as PET. In a case where a metal is used as the U-shaped pin, a surface of the pin is covered with a nonconductor to prevent a short circuit. A plurality of the U-shaped pins as described above are embedded in the flexible member 11, and the first metal layer 12 and/or the second metal layer 13 are brought into close contact with the flexible member 11 so as to be caught by the pins. Note that the U-shaped pin can be embedded by, for example, inserting a linear pin so as to penetrate the flexible member 11 and then bending a tip end of the pin.

The microstrip antenna 1C having the above configuration is curved as shown in FIG. 11. Since at least one of the first metal layer 12 and the second metal layer 13 is not adhered to the flexible member 11, the metal layer is curved while sliding with respect to the flexible member 11 to absorb the difference in the shrinkage rate described above. Therefore, even when the microstrip antenna 1C is curved, the metal layer is not creased or broken.

Figure 12:
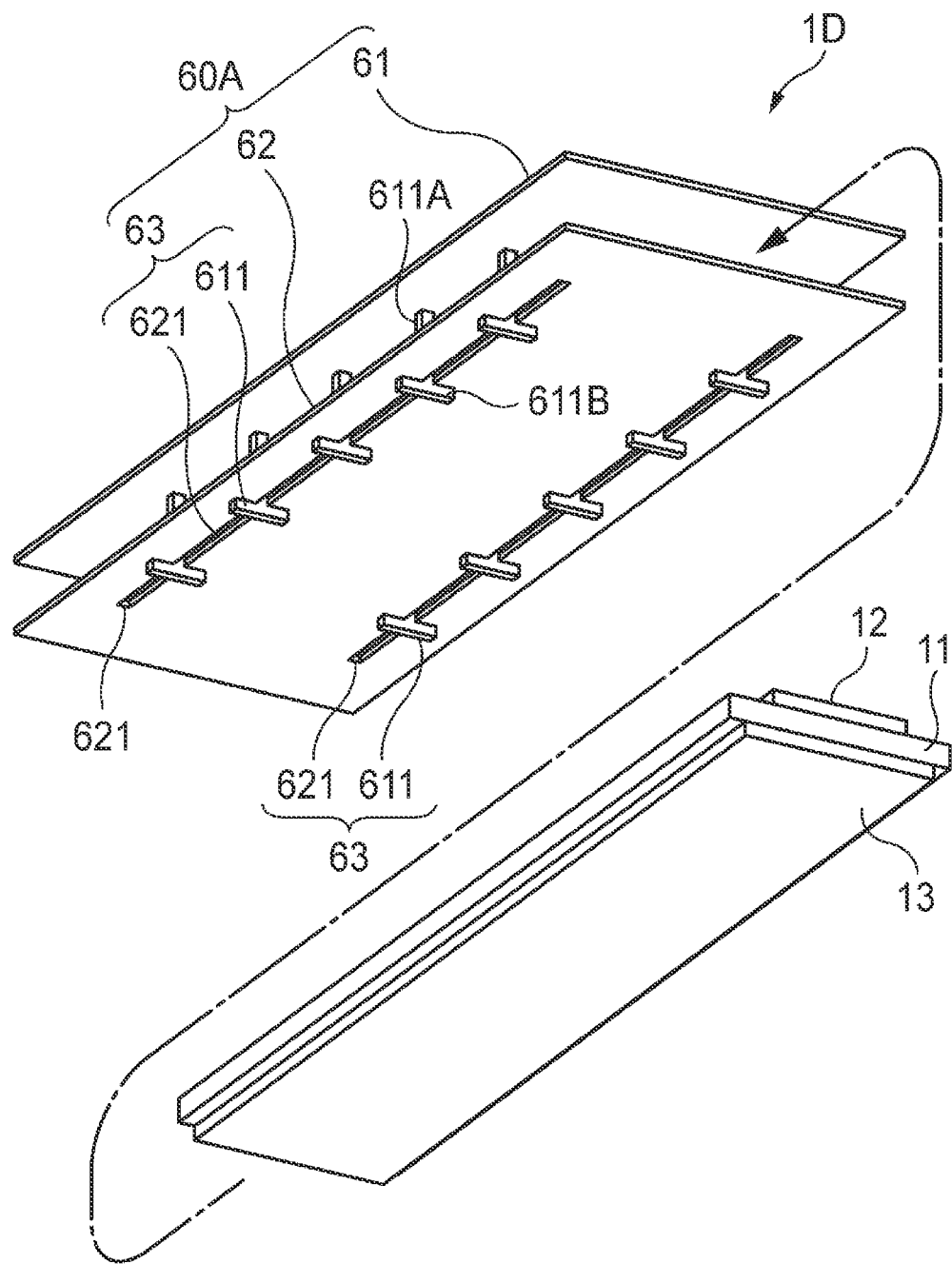
FIG. 12 is a diagram showing a microstrip antenna 1D according to a fourth embodiment of the present disclosure, in which a first metal layer 12, a flexible member 11, and a second metal layer 13 are inserted into a clamping mechanism 60A and are clamped by the clamping mechanism 60A.
Figure 13:
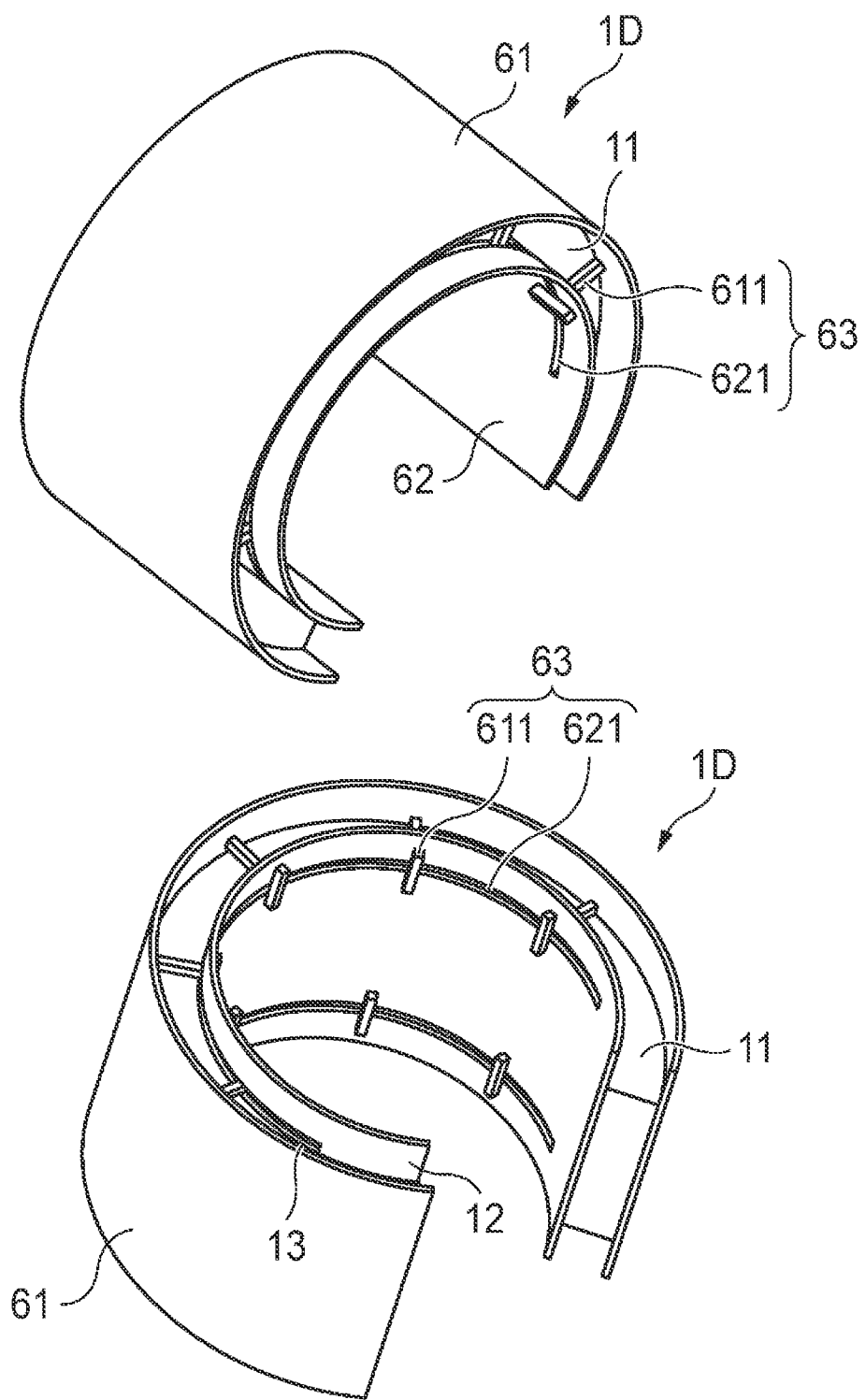
FIG. 13 is a diagram showing the microstrip antenna 1D according to the fourth embodiment of the present disclosure and showing a curved state of the microstrip antenna 1D.

FIG. 12 shows a microstrip antenna 1D according to a fourth embodiment of the present disclosure, and is a diagram showing that the first metal layer 12, the flexible member 11, and the second metal layer 13 are inserted into a clamping mechanism 60A and are clamped by the clamping mechanism 60A. FIG. 13 is a diagram showing the microstrip antenna 1D according to the fourth embodiment of the present disclosure and showing a curved state of the microstrip antenna 1D.

A point that the microstrip antenna 1D includes the flexible member 11, the first metal layer 12, and the second metal layer 13 is the same as that in the first embodiment described with reference to FIGS. 1 to 4. In addition, points that the microstrip antenna 1D is formed by sandwiching the flexible member 11 between the first metal layer 12 and the second metal layer 13, the predetermined thickness d of the flexible member 11 and the material of each member are the same as those in the first embodiment.

In the fourth embodiment, the clamping mechanism 60A functions as the close contact unit 14 described above. A structure of the clamping mechanism 60A will be described below with reference to FIG. 12.

The clamping mechanism 60A includes a first plate 61, a second plate 62, and connecting members 63. The first plate 61 and the second plate 62 are each formed by molding synthetic resin or the like in a thin planar shape. As an example, the synthetic resin may be PET. However, the present disclosure is not limited thereto. The first plate 61 and the second plate 62 face each other and are connected by the connecting members 63.

Surfaces of the first plate 61 and the second plate 62 that face each other are referred to as inner surfaces. Surfaces of the first plate 61 and the second plate 62 that are opposite to the inner surfaces are referred to as outer surfaces.

The connecting member 63 includes T-shaped protrusions 611 fixed to the first plate 61 and a guide groove 621 provided in the second plate 62.

The guide groove 621 extends in a longitudinal direction of the second plate 62. For example, two guide grooves 621 are arranged along a lateral direction of the second plate as shown.

On the other hand, the T-shaped protrusion 611 includes a leg portion 611A and a distal end portion 611B. In a state in which the distal end portion 611B is caught on the outer surface of the second plate 62, the leg portion 611A passes through the guide groove 621 and is fixed to the inner surface of the first plate 61.

With the above structure, the first plate 61 and the second plate 62 are slidable with each other in the longitudinal direction of the respective plates.

The flexible member 11 and the first metal layer 12 and the second metal layer 13 respectively arranged on both surfaces of the flexible member 11 are inserted between the first plate 61 and second plate 62 that face each other.

By appropriately adjusting a length of the leg portion 611A included in the T-shaped protrusion 611, the clamping mechanism 60A presses the first metal layer 12 and the second metal layer 13 against the flexible member 11. That is, the first metal layer 12 and the second metal layer 13 are brought into close contact with the flexible member 11 in such a manner that the first metal layer 12 and the second metal layer 13 are sandwiched from the outside by the clamping mechanism 60A.

The microstrip antenna 1D having the above configuration is curved as shown in FIG. 13. Then, the T-shaped protrusion 611 slides along the guide groove 621, and the first plate 61 and the second plate 62 are appropriately curved.

Since at least one of the first metal layer 12 and the second metal layer 13 is not adhered to the flexible member 11, the metal layer is curved while sliding with respect to the flexible member 11 to absorb the difference in the shrinkage rate described above. Therefore, even when the microstrip antenna 1D is curved, the metal layer is not creased or broken.

Figure 14:
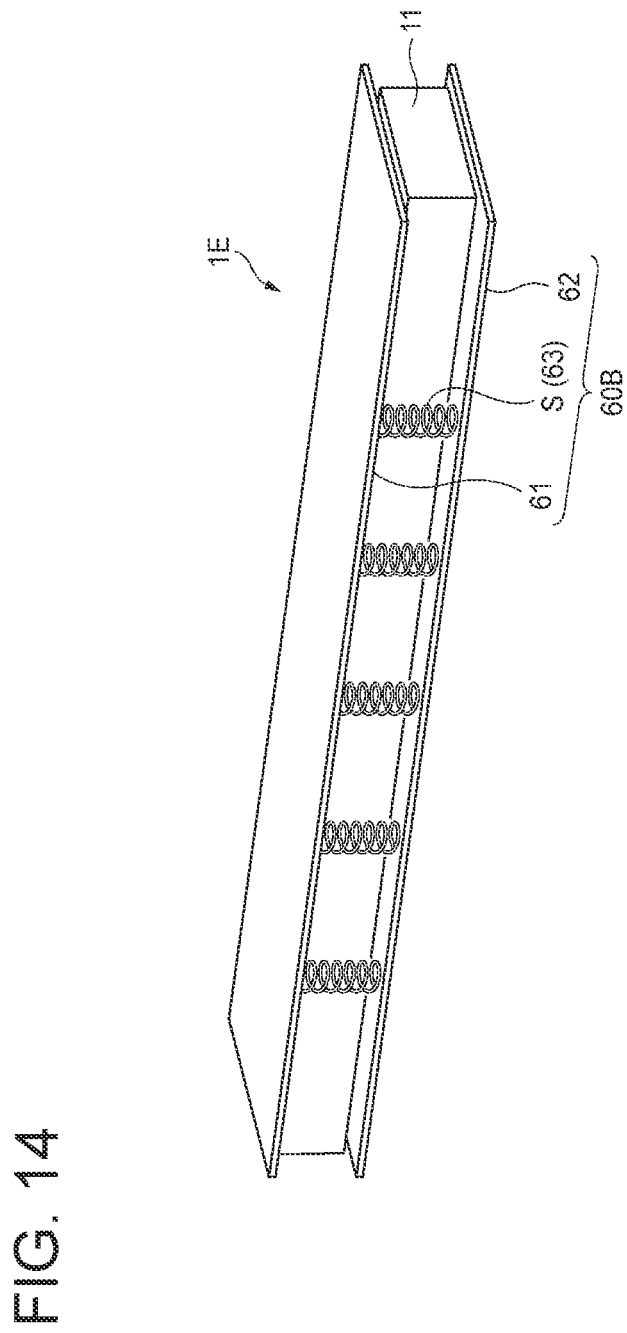
FIG. 14 is a diagram showing a microstrip antenna 1E according to a fifth embodiment of the present disclosure.

FIG. 14 is a diagram showing a microstrip antenna 1E according to a fifth embodiment of the present disclosure.

A point that the microstrip antenna 1E includes the flexible member 11, the first metal layer 12, and the second metal layer 13 is the same as that in the first embodiment described with reference to FIGS. 1 to 4. In addition, points that the microstrip antenna 1E is formed by sandwiching the flexible member 11 between the first metal layer 12 and the second metal layer 13, the predetermined thickness d of the flexible member 11 and the material of each member are the same as those in the first embodiment.

This is the same as the fourth embodiment in that the clamping mechanism functions as the close contact unit 14, and the two metal layers and the flexible member 11 are brought into close contact with each other.

The microstrip antenna 1E according to the fifth embodiment of the present disclosure shown in FIG. 14 uses a clamping mechanism 60B. Like the clamping mechanism 60A, the clamping mechanism 60B includes the first plate 61, the second plate 62, and the connecting member 63. Since the first plate 61 and the second plate 62 are the same as those of the fourth embodiment shown in FIGS. 12 and 13, the description thereof will be omitted.

In the fifth embodiment of the present disclosure, the connecting member 63 includes elastic bodies S. The elastic body S is typically a spring. One end of the elastic body S is fixed to the first plate 61, and the other end thereof is fixed to the second plate 62.

As shown in FIG. 14, the flexible member 11 and the first metal layer 12 and the second metal layer 13 respectively arranged on both surfaces of the flexible member 11 are inserted between the first plate 61 and second plate 62 that face each other.

By appropriately adjusting an elastic force of the elastic body S, the clamping mechanism 60B presses the first metal layer 12 and the second metal layer 13 against the flexible member 11. That is, the first metal layer 12 and the second metal layer 13 are brought into close contact with the flexible member 11 in such a manner that the first metal layer 12 and the second metal layer 13 are sandwiched from the outside by the clamping mechanism 60B.

Note that a state in which the microstrip antenna 1E is curved is the same as that of the fourth embodiment shown in FIGS. 12 and 13, and therefore illustration thereof is omitted. Since at least one of the first metal layer 12 and the second metal layer 13 is not adhered to the flexible member 11, the metal layer is curved while sliding with respect to the flexible member 11 to absorb the difference in the shrinkage rate described above. Therefore, even when the microstrip antenna 1E is curved, the metal layer is not creased or broken.

Figure 15:
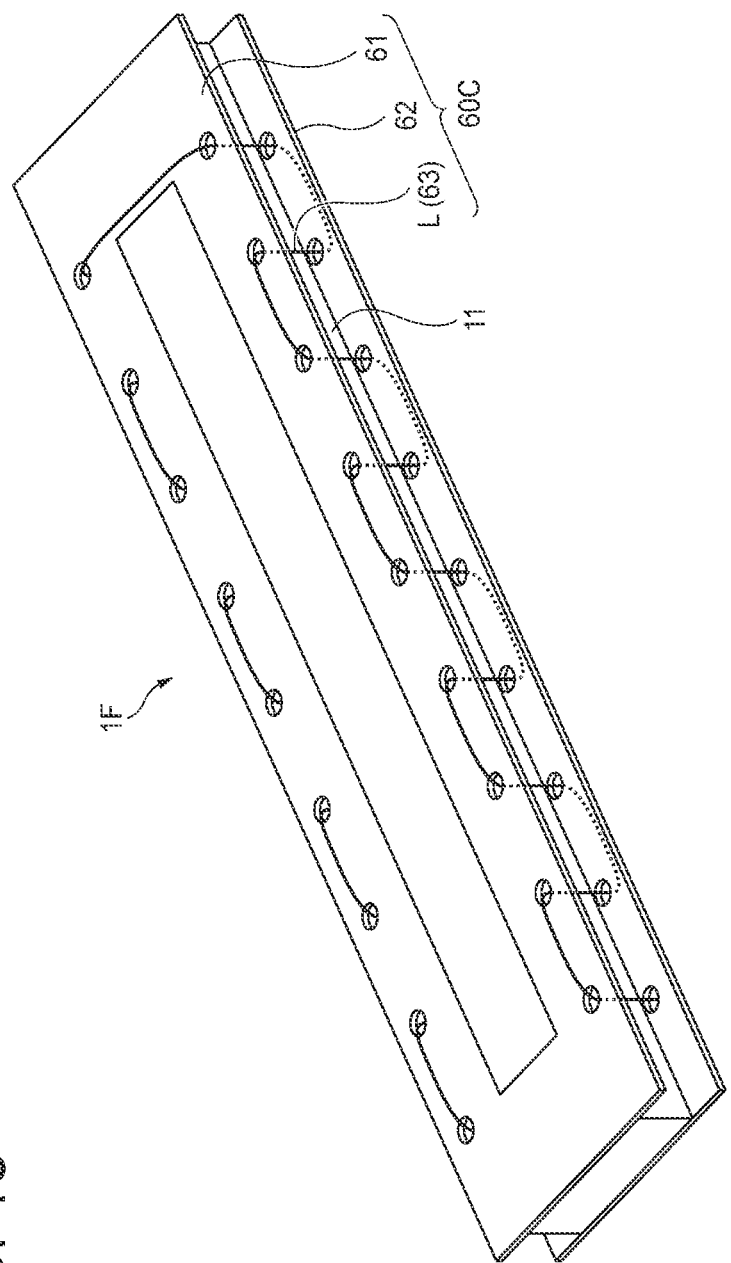
FIG. 15 is a diagram showing a microstrip antenna 1F according to a sixth embodiment of the present disclosure.

FIG. 15 is a diagram showing a microstrip antenna 1F according to a sixth embodiment of the present disclosure.

A point that the microstrip antenna 1F includes the flexible member 11, the first metal layer 12, and the second metal layer 13 is the same as that in the first embodiment described with reference to FIGS. 1 to 4. In addition, points that the microstrip antenna 1F is formed by sandwiching the flexible member 11 between the first metal layer 12 and the second metal layer 13, the predetermined thickness d of the flexible member 11 and the material of each member are the same as those in the first embodiment.

This is the same as the fourth embodiment in that the clamping mechanism functions as the close contact unit 14, and the two metal layers and the flexible member 11 are brought into close contact with each other.

The microstrip antenna 1F according to the sixth embodiment of the present disclosure shown in FIG. 15 uses a clamping mechanism 60C. Like the clamping mechanism 60A, the clamping mechanism 60C includes the first plate 61, the second plate 62, and the connecting member 63. Since the first plate 61 and the second plate 62 are the same as those of the fourth embodiment shown in FIGS. 12 and 13, the description thereof will be omitted.

In the sixth embodiment of the present disclosure, the connecting member 63 is made of a thread L. The thread L exemplarily has a certain degree of stretchability, and a rubber may be used. On the other hand, a plurality of holes are formed in the first plate 61 and the second plate 62 along the longitudinal direction of the plates. The first plate 61 and the second plate 62 are connected by passing the thread L through the plurality of holes.

As shown in FIG. 15, the flexible member 11 and the first metal layer 12 and the second metal layer 13 respectively arranged on both surfaces of the flexible member 11 are inserted between the first plate 61 and second plate 62 that face each other.

By appropriately adjusting tension of the thread L, the clamping mechanism 60C presses the first metal layer 12 and the second metal layer 13 against the flexible member 11. That is, the first metal layer 12 and the second metal layer 13 are brought into close contact with the flexible member 11 in such a manner that the first metal layer 12 and the second metal layer 13 are sandwiched from the outside by the clamping mechanism 60C.

Note that a state in which the microstrip antenna 1F is curved is the same as that of the fourth embodiment shown in FIGS. 12 and 13, and thus the description thereof is omitted. Since at least one of the first metal layer 12 and the second metal layer 13 is not adhered to the flexible member 11, the metal layer is curved while sliding with respect to the flexible member 11 to absorb the difference in the shrinkage rate described above. Therefore, even when the microstrip antenna 1F is curved, the metal layer is not creased or broken.

FIG. 16 is a diagram showing a microstrip antenna 1G according to a seventh embodiment of the present disclosure.

A point that the microstrip antenna 1G includes the flexible member 11, the first metal layer 12, and the second metal layer 13 is the same as that in the first embodiment described with reference to FIGS. 1 to 4. In addition, points that the microstrip antenna 1G is formed by sandwiching the flexible member 11 between the first metal layer 12 and the second metal layer 13, the predetermined thickness d of the flexible member 11 and the material of each member are the same as those in the first embodiment.

In the microstrip antenna 1G according to the seventh embodiment of the present disclosure shown in FIG. 16, a bag body P functions as the close contact unit 14. The flexible member 11, the first metal layer 12, and the second metal layer 13 are sealed in the bag body P and the inside of the bag body P is evacuated. As the bag body P, a material that can be curved without causing air leakage, for example, nylon or the like is used.

Since a pressure in the inside of the bag body P becomes smaller than a pressure outside the bag body P, the first metal layer 12 and the second metal layer 13 are pressed against the flexible member 11. That is, the first metal layer 12 and the second metal layer 13 are brought into close contact with the flexible member 11 by the bag body P.

The microstrip antenna 1G having the above configuration is curved. Since at least one of the first metal layer 12 and the second metal layer 13 is not adhered to the flexible member 11, the metal layer is curved while sliding with respect to the flexible member 11 to absorb the difference in the shrinkage rate described above. Therefore, even when the microstrip antenna 1G is curved, the metal layer is not creased or broken.

As described above, the structure of the microstrip antenna in which the metal layer is not creased or broken even when the wearable sensor terminal T is curved when the wearable sensor terminal T is worn on the human body has been described. Here, there are two metal layers, the first metal layer 12 and the second metal layer 13, that sandwich the flexible member 11. The first metal layer 12 and the second metal layer 13 may be point-joined to each other by bending or the like so that the positions of the first metal layer 12 and the second metal layer 13 do not shift from each other.

The point-joining will be described based on the microstrip antenna 1A according to the first embodiment. However, the same applies to the microstrip antennas 1B to 1G according to other embodiments.

The point-joining between the first metal layer 12 and the second metal layer 13 may be performed by, for example, pinning a center of the first metal layer 12. However, a positioned where the pinning is performed is not limited to this. The microstrip antenna 1A is curved in a state in which the pinning is performed. Then, in the metal layer that is not adhered to the flexible member 11, a portion other than the pinned joint point follows the curving of the flexible member 11 and is curved while sliding. As a result, the difference in the shrinkage ratio described above is absorbed. Therefore, even when the microstrip antenna 1A is curved, the metal layer is not creased or broken.

Here, in a case where the pinning is performed between the first metal layer 12 and the second metal layer 13 in order to prevent positional shifting of the metal layer, it is more efficient if the pin is used for power feeding in a pin power feeding method. That is, the pinning is performed at a predetermined feeding point for feeding power to a circuit connected to the microstrip antenna. A position of the feeding point is determined from the viewpoint of impedance matching, and is generally a position separated by λ/6 from a center of a radiation element (first metal layer 12), for example.

In a case where the pin is used for the power feeding, a joint point related to point-joining between the first metal layer 12 and the second metal layer 13 coincides with a feeding point for feeding power to the circuit connected to the microstrip antenna.

On the other hand, in a case where power is fed to the circuit connected to the microstrip antenna by an electromagnetic coupling power feeding method, it is not necessary to provide a physical transmission path such as a pin at the feeding point. In this case, the pinning for preventing the positional shifting of the metal layers may be performed at any position other than the feeding point.

The position at which various circuits are arranged is exemplarily the ground side between the radiation element (first metal layer 12) side and the ground (second metal layer 13) side. This is to prevent the circuit from interfering with the radiation by the radiation element (first metal layer 12). However, the circuit connected to a portion after rectification can be separated from the microstrip antenna by drawing a lead wire. On the other hand, since a rectifier circuit that performs the rectification handles RF high frequency, the rectifier circuit is exemplarily arranged in the vicinity of the microstrip antenna.

As described above, when the microstrip antenna is curved, the metal layer in close contact with the flexible member may be curved so as to follow the flexible member, and the distance between the first metal layer and the second metal layer may not change before and after the curving. As a result, a performance of the microstrip antenna is stabilized even when the wearable sensor terminal T having the microstrip antenna therein is wound around a wrist or the like.

In the above configuration, the close contact unit may be the rubber member, the slot provided in the flexible member, the U-shaped pin, the bag body that can be evacuated inside, or the like. According to the above configuration, the microstrip antenna can be configured such that the first metal layer and/or the second metal layer are not adhered to the flexible member but are in close contact with the flexible member by the close contact unit.

In the above configuration, the close contact unit may be the clamping mechanism including the first plate, the second plate, and the connecting member, and the first plate and the second plate may be connected to each other by the connecting member in a state in which the first plate and the second plate face each other. According to the above configuration, the first metal layer and the second metal layer are brought into close contact with the flexible member in such a manner that the first metal layer and the second metal layer are sandwiched from the outside by the clamping mechanism.

In the above configuration, the connecting member may include the T-shaped protrusion fixed to the first plate and the guide groove provided in the second plate, and the guide groove may extend along the longitudinal direction of the second plate. Further, the connecting member may be the elastic body, a plurality of holes provided along the longitudinal direction of the first plate and the second plate, and a thread passing through the holes. According to the above configuration, the first plate and the second plate can be appropriately connected in a state corresponding to the curving.

In the above configuration, the first metal layer and the second metal layer may be point-joined to each other. According to the above configuration, the positions of the first metal layer and the second metal layer can be prevented from shifting due to curving or the like.

In the above configuration, the joint point related to the point-joining between the first metal layer and the second metal layer may coincide with a feeding point for feeding power to a circuit connected to the microstrip antenna. According to the above configuration, the point-joining for preventing positional shifting between the first metal layer and the second metal layer can be used for feeding power to the circuit.

The wearable sensor terminal may include a microstrip antenna having the above configuration. According to the above configuration, it is possible to provide a wearable battery-less sensor terminal at low cost by providing a sensor terminal provided with a microstrip antenna having a two-layer structure having a predetermined thickness with sufficient flexibility as a whole.

Although various embodiments have been described above with reference to the drawings, it is needless to say that the present disclosure is not limited thereto. It will be apparent to those skilled in the art that various changes and modifications can be conceived within the scope of the claims, and it is also understood that the various changes and modifications belong to the technical scope of the disclosure. In addition, the respective constituent elements in the above-described embodiments may be optionally combined within a range not departing from the gist of the present disclosure.

(Supplementary Note)

(1) A microstrip antenna including:
  a first metal layer that constitutes an antenna element;
  a second metal layer that constitutes a ground; and
  a flexible member that separates the first metal layer and the second metal layer by a predetermined distance,
  in which the first metal layer and the second metal layer each are made of a metal having flexibility or made of a metal foil formed on a material having flexibility, and
  in which the first metal layer and/or the second metal layer are not adhered to the flexible member but are in close contact with the flexible member by a close contact unit.

(2) The microstrip antenna according to the above (1),
  in which in a case that the microstrip antenna is curved, a metal layer that is in close contact with the flexible member is curved so as to follow the flexible member, and a distance between the first metal layer and the second metal layer does not change before and after curving of the microstrip antenna.

(3) The microstrip antenna according to the above (1) or (2),
  in which the close contact unit is a rubber member.

(4) The microstrip antenna according to the above (1) or (2),
  in which the close contact unit is a slat included in the flexible member.

(5) The microstrip antenna according to the above (1) or (2),
  in which the close contact unit is a U-shaped pin.

(6) The microstrip antenna according to the above (1) or (2),
  in which the close contact unit is a clamping mechanism including a first plate, a second plate, and a connecting member,
  in which the first plate and the second plate are connected to each other by the connecting member in a state that the first plate and the second plate face each other,
  in which the connecting member includes a T-shaped protrusion fixed to the first plate and a guide groove provided in the second plate, and
  in which the guide groove extends along a longitudinal direction of the second plate.

(7) microstrip antenna according to the above (1) or (2),
  in which the close contact unit is a clamping mechanism including a first plate, a second plate, and a connecting member,
  in which the first plate and the second plate are connected to each other by the connecting member in a state that the first plate and the second plate face each other, and
  in which the connecting member is an elastic body.

(8) The microstrip antenna according to the above (1) or (2),
  in which the close contact unit is a clamping mechanism including a first plate, a second plate, and a connecting member,
  in which the first plate and the second plate are connected to each other by the connecting member in a state that the first plate and the second plate face each other, and
  in which the connecting member includes a plurality of holes provided along a longitudinal direction of the first plate and the second plate, and a thread passing through the holes.

(9) The microstrip antenna according to the above (1) or (2),
  in which the close contact unit is a bag body capable of being evacuated inside.

(10) The microstrip antenna according to any one of the above (1) to (9),
  in which the first metal layer and the second metal layer are point joined to each other.

(11) The microstrip antenna according to the above (10),
  in which a joint point related to the point-joining between the first metal layer and the second metal layer coincides with a feeding point for feeding power to a circuit connected to the microstrip antenna.

(12) A wearable sensor terminal including:
  the microstrip antenna according to any one of the above (1) to (11).

What is claimed is:

1. A microstrip antenna comprising:
  a first metal layer that constitutes an antenna element;
  a second metal layer that constitutes a ground; and
  a flexible member that separates the first metal layer and the second metal layer by a predetermined distance,
  wherein the first metal layer and the second metal layer each are made of a metal having flexibility or made of a metal foil formed on a material having flexibility;
  wherein at least one of the first metal layer and the second metal layer is not adhered to the flexible member but is in close contact with the flexible member by a close contact unit;
  wherein the close contact unit is a clamping mechanism including a first plate, a second plate, and a connecting member;
  wherein the first plate and the second plate are connected to each other by the connecting member in a state that the first plate and the second plate face each other; and
  wherein the connecting member is an elastic body.

2. The microstrip antenna according to claim 1,
  wherein in a case that the microstrip antenna is curved, a metal layer that is in close contact with the flexible member is curved so as to follow the flexible member, and a distance between the first metal layer and the second metal layer does not change before and after curving of the microstrip antenna.

3. The microstrip antenna according to any one of claim 1,
  wherein the first metal layer and the second metal layer are point-joined to each other.

4. The microstrip antenna according to claim 3,
  wherein a joint point related to the point joining between the first metal layer and the second metal layer coincides with a feeding point for feeding power to a circuit connected to the microstrip antenna.

5. A wearable sensor terminal comprising:
  the microstrip antenna according to claim 1.

* * * * *